United States Patent [19]
Delagebeaudeuf et al.

[11] Patent Number: 4,471,366
[45] Date of Patent: Sep. 11, 1984

[54] FIELD EFFECT TRANSISTOR WITH HIGH CUT-OFF FREQUENCY AND PROCESS FOR FORMING SAME

[75] Inventors: Daniel Delagebeaudeuf; Tranc L. Nuyen, both of Paris, France

[73] Assignee: Thomson-CSF, Paris, France

[21] Appl. No.: 353,100

[22] Filed: Mar. 1, 1982

Related U.S. Application Data

[63] Continuation of Ser. No. 133,444, Mar. 24, 1980, abandoned.

[30] Foreign Application Priority Data

Mar. 28, 1979 [FR] France .............................. 79 07803
Sep. 6, 1979 [FR] France .............................. 79 22301

[51] Int. Cl.³ ......................................... H01L 29/161
[52] U.S. Cl. ..................................... 357/16; 357/23.2; 357/23.7; 357/23.15; 357/61
[58] Field of Search ................ 357/23 R, 23 NS, 23 I, 357/16, 23 TF, 61

[56] References Cited

U.S. PATENT DOCUMENTS

4,160,261 7/1979 Casey, Jr. ..................... 357/23 NS

Primary Examiner—Martin H. Edlow
Attorney, Agent, or Firm—Oblon, Fisher, Spivak, McClelland & Maier

[57] ABSTRACT

There is disclosed a heterojunction field effect transistor with an accumulation of majority carriers functioning as a high cut-off frequency device in which the transistor uses the properties of the same type $GaAs/Al_xGa_{1-x}As$ N-doped junctions with the GaAs being weakly doped. This is used to produce a high mobility of charges in the accumulation layer and is effected by a structure in which the source and drain regions are partially covered by the gate region which is in turn covered by an insulation layer and thereby reduces the access resistances and increases the transition frequencies.

8 Claims, 12 Drawing Figures

FIELD EFFECT TRANSISTOR WITH HIGH CUT-OFF FREQUENCY AND PROCESS FOR FORMING SAME

This is a continuation, of application Ser. No. 133,444, filed Mar. 24, 1980 now abandoned.

BACKGROUND OF THE INVENTION

1. Field of the Invention

The present invention relates to semi-conductor devices of the field effect transistor type, and more especially those whose cut-off frequencies are measured in gigahertz.

2. Description of the Prior Art

Known transistor type devices work at frequencies up to a few gigahertz. To increase their cut-off frequencies several possibilities are open: change the structure and the dimensions of the device or change the nature of the materials used for making it.

Among the known structures of field effect transistors, currently designated by the abbreviation FET, are: the MOS-FETs, the MES-FETs, the junction FETs, and heterojunction gate FETs of type P. The MOS-FETs has a structure having a metal-oxide-semiconductor material stack, from whence the name MOS, which operate with silicon under type inversion conditions, in the vicinity of the oxide layer. By reducing to a minimum the dimensions of the electrodes and the distances between electrodes so as to reduce the transfer time of a charge carrier, cut-off frequencies of the order of 5 gigahertz can be obtained. The GaAs based MOS-FETs exist in the design stage n the laboratory and operate in the depletion region. Their performances are similar to those of the MES-FETs which will be described hereafter.

The MES-FETs, the simplest structure which only has a metal and a semiconductor (ME-S) operate in depletion, i.e. the charge carriers are deflected, under the control electrode, and pinched, due to this field of this electrode between the depletion zone and the semi-insulating substrate.

A junction FET has as a gate the semiconductor of a type opposite that which forms the depletion zone. The FETs with a GaAs have as gate GaAs of type P.

The heterojunction FETs, which one skilled in the art knows concerns the use of two different semiconductors has a gate formed of the P type. The transistor works in charge depletion in the active N type layer doped at the upper level to $10^{16}$ at/cm$^3$.

The frequencies obtained with these types of FET, although high are not yet sufficient, for the multiplicity of communications, especially by satellite. The overcrowding of the frequency bands results in unceasingly pushing the frequencies used back towards bands not yet used.

It is to comply with these requirements that a new field effect transistor has been perfected. Based on a heterojunction between materials of different mixtures, its operation relies on the existance of a type N channel whose conductance can be modulated by action on the polarization of an N type gate. This gate is a semiconductor having a wider inhibited band than that of the material supporting the channel, with the material being the purest possible N type with doping less than $10^{16}$ e/cm$^3$. The cut-off frequency of such a transistor is about 30% higher than that of known MES-FETs.

This semiconductor device constitutes a progress in relation to the prior art and yet presents two types of limitation:

in the first place, the potential barrier between the GaAs layer and the Al$_x$Ga$_{1-x}$As layer may not be sufficiently high to prevent a considerable leakage of current due for example to the tunnel effect between the gate and the active layer when a positive voltage is applied to the gate, in the second place, as a result of to the arrangement of the source and drain in relation to the gate region, the source-drain current crosses two zones formed from weakly doped GaAs, and is thus highly resistive. The access resistances equivalent to these two zones and called R$_s$ between source and gate and R$_d$ between gate and drain are high. Thus they limit the performance of the transistors at high frequency. The structures proposed allow nevertheless resistances R$_s$ and R$_d$ to be considerably reduced by reducing the dimensions of the resistive zones with a low doping level. But the resistances R$_s$ and R$_d$ thus obtained remain however higher than those met with in transistors of the prior art such as those called MES-FETs.

The invention is then completed by two improvements, of which:

the first consists in reducing the leakage current between the gate and the active layer to values comparable with those which are met with in field effect transistors of the prior art. This result is obtained by reducing the thickness of the Al$_x$Ga$_{1-x}$As layer to a few hundred angstrom and by inserting an insulating material between this Al$_x$Ga$_{1-x}$As layer and the gate metallization;

and the second consists in reducing the access resistances R$_s$ and R$_d$ to values comparable with those which are obtained in field effect transistors of the prior art. This result is obtained by bringing the source and drain regions into the vicinity of the electron accumulation zone which is in the active GaAs layer and adjacent the Al$_x$Ga$_{1-x}$As layer, thus suppressing the path of the source-drain current in the resistive zones with low doping level.

BRIEF SUMMARY OF THE INVENTION

More precisely, the invention consists of a field effect transistor which has on the one hand two so-called source and drain access regions and on the other hand a control region composed of an active layer and a gate whose interface forms a junction, both supported by a semi-insulating substrate. This transistor is characterized in that:

in the first place, the junction is a heterojunction between two different materials, GaAs for the active layer, Al$_x$Ga$_{1-x}$As for the gate, GaAs being of type N with an electron concentration less than $10^{16}$e/cm$^3$, and Al$_x$Ga$_{1-x}$As of type N, with x between 0.2 and 1, in the second place, the Al$_x$Ga$_{1-x}$As layer has a thickness between one hundred and two thousand angstrom and is covered by an insulating layer inserted between the Al$_x$Ga$_{1-x}$As layer and the gate contacting metallization in the third place, the two source and drain regions are extended into the active GaAs layer up to the region of electron accummulation, adjacent the heterojunction between GaAs amd Al$_x$Ga$_{1-x}$As.

The above and other objects, features and advantages of the present invention will become apparent from the following description, given solely by way of non limit-

DESCRIPTION OF THE PREFERRED EMBODIMENTS

Figure 1:
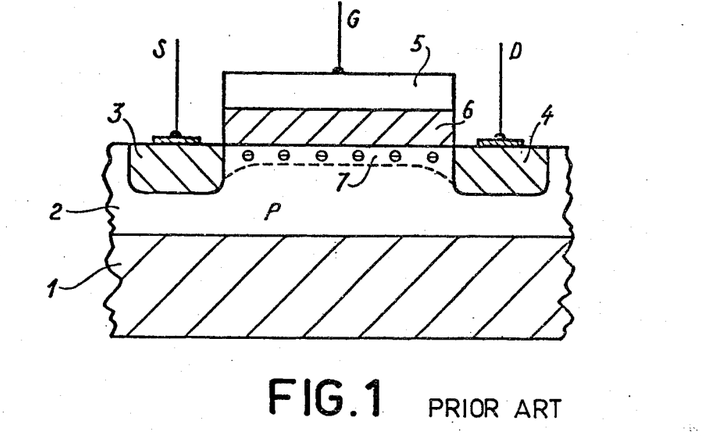
FIG. 1 is a schematical view in section of a MOS-FET of the prior art.

FIG. 1 shows schematically a MOS-FET transistor seen in section.

With a substrate 1 there is associated a region 2, obtained either by epitaxy or by diffusion of impurities which modify the resistivity of the basic material, this region 2 being for example of type P. Two regions 3 and 4 are diffused in region 2, one forms the so-called source electrode 3, and the other forms the so-called drain electrode 4, completed by surface metallizations and soldering of connecting wires. The control electrode 5, called a gate, is formed by a metallization deposited on an oxide layer 6. This is why this transistor is of the MOS type: it is formed by a metal, a semiconductor such as silicon and its oxide $SiO_2$. This transistor operates in so-called inversion conditions, i.e. under the action of the electric field there is formed a layer 7 against the oxide region 6, the carriers in this layer 7 being electrons, whereas region 2—in which layer 7 is created—is of type P.

This inversion type transistor is limited in frequency, as has been mentioned, when it is made from silicon. Attempts with other materials have not been fully satisfactory: for example by using GaAs for region 2, an oxide layer 6 of suitable quality cannot be deposited.

Figure 2:
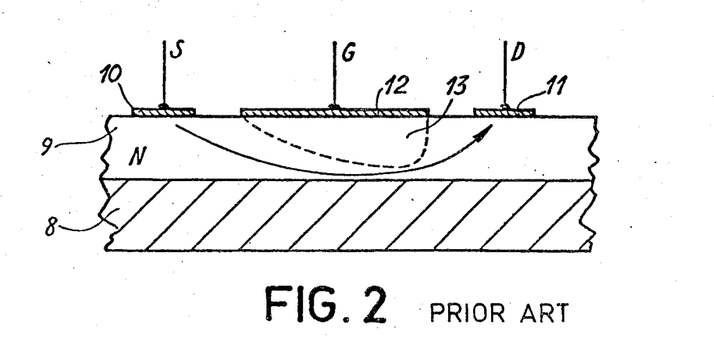
FIG. 2 is a schematical view in section of a MES-FET of the prior art.

FIG. 2 shows schematically a MES-FET transistor seen in section.

On a semi-insulating substrate is deposited a region 9 of an N type semiconductor material for example. The source 10, drain 11 and gate 12 electrodes are obtained by metallization of the corresponding zones on the free surface of region 9. Under the action of a control voltage, the majority carriers are nipped between control field region 13 developed in region 9 and the junction between the two semiconductor 9 and semi-insulating 8 regions. This structure requires doping of the active layer greater than $10^{16} at/cm^3$, which results in low mobility of the charge carriers. The heterojunction field effect transistor of the invention has a cut-off frequency of the order of 30% greater than those of the MES-FET transistors mentioned above. This is due to the particular properties of the $GaAs/Al_xGa_{1-x}As$ heterojunction.

Contrary to the pair of materials Ga/GaAs where difficulties of a technological and perhaps of a physical kind cause the interface to be of a mediocre quality and a carrier of a considerable fixed negative charge, the $GaAs/Al_xGa_{1-x}As$ pair seems to behave in a substantially ideal way. The presence of possible traps or centres of recombination at the interface have not been revealed and the transition may be very abrupt. Moreover, the absence of a negative interface charge permits, in the proposed structures, the existence of an electron accummulation layer on the GaAs side. The heterojunction satisfies then the model proposed by Anderson in an article entitled "germanium gallium arsenide heterojunctions" (IBM journal, July 1960, pages 283-287). This property has been verified by Dingle et al in an article entitled "Electron mobilities in modulation doped semiconductor heterojunction superlattice" (App. Phys. lett vol 33, no 7, page 665 (1968)), on a "superlattice" structure formed by a regular stack of alternating layers of non intentionally doped GeAs and N doped $Al_xGa_{1-x}As$. In GaAs potential holes, a high electron concentration has been demonstrated and an excellent mobility measured close to the mobility of the non intentionally doped GaAs material. It is very doubtful whether this is a specific effect of the superlattice. It is rather a property of the accumulation layers predicted by Anderson and located in GaAs at each interface. The good mobility observed would then result from the character of purity of the GaAs material supporting them. To sum up, in the case of an GaAs N(little doped)/$Al_xGa_{1-x}As$ (N) isotypic heterojunction:

the transition may be very abrupt;

the interface is substantially ideal; few traps, few recombination centers, little fixed charge;

there exists an electron accumulation layer in the GaAs material;

the mobility in the accummulation layer is close to the mobility in volume of the material supporting it (GaAs) and so is not degraded by the adjacency of the interface.

The result is that, for a weakly doped GaAs layer where the volume mobility is close to the limit mobility ($\sim 8000\ cm^2/v.s$), this characteristic is to be found again in the accumulation layer. Another important consequence for the invention is that the electron velocity at the threshold field marking the beginning of the intervalley electron transfer must also be high in the accumulation layer and reach a value close on $2 \times 10^7\ cm/s$ characterizing a very pure material.

Figure 3:
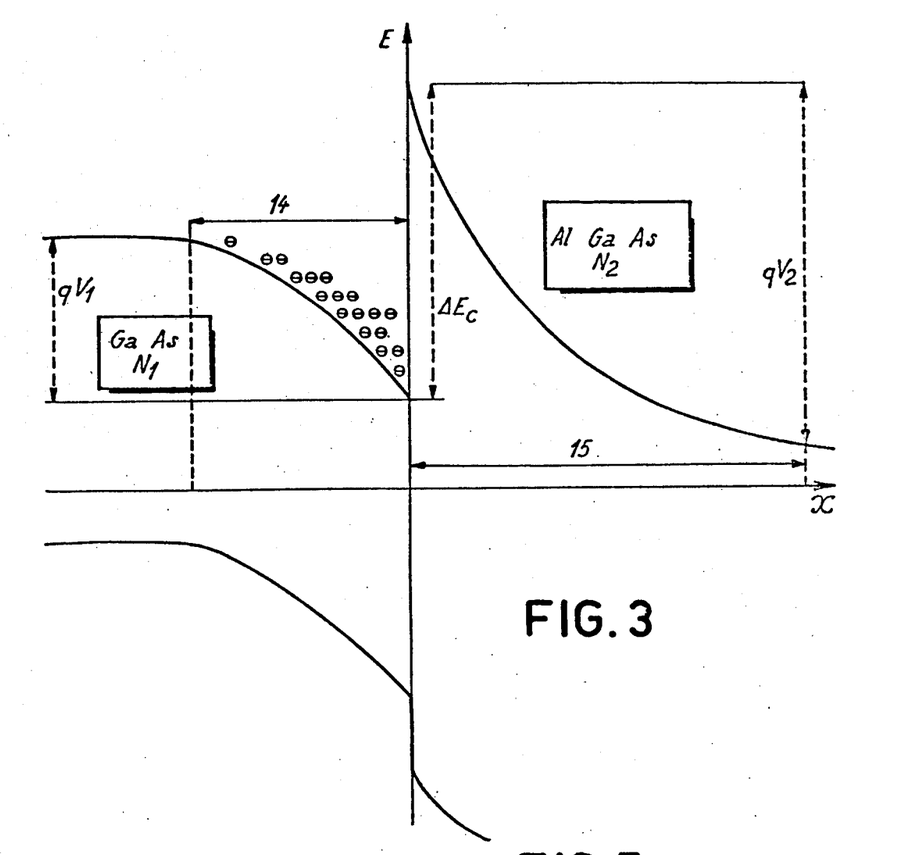
FIG. 3 is a diagram of the energy bands of an N—N isotypic heterojunction, corresponding to the heterojunction of FIG. 1.

FIG. 3 shows the band diagram of an N—N isotypic $GaAs/Al_xGa_{1-x}As$ heterojunction, i.e. that the two materials are of the same doping type with positive polarisation on the $Al_xGa_{1-x}As$ side.

With the interface of the junction being in the middle of the abscissa of the diagram, the band situated on one side of this junction corresponds to the GaAs region of the transistor, weakly doped at level $N_1$ and the band situated on the other side of the junction corresponds to the $Al_xGa_{1-x}As$ gate region of the transistor, also N doped but to another concentration $N_2$.

As ordinates are shown the energies. For a positive grid biasing there appear adjacent the junction a depletion zone 15 in the $Al_xGa_{1-x}As$ gate and an accumulation zone 14 for majority carriers (electrons) in the GaAs region.

A positive voltage on the gate increases the negative electric charge of the accumulation layer and therefore increases the conductivity of the channel.

The doping $N_1$ on the GaAs side is chosen as low as possible, e.g. $10^{15}$ at/cm$^3$, so that the mobility therein is close to the limit mobility (8000 cm$^2$/v.s) and relatively high on the $Al_xGa_{1-x}As$ $N_2$ side, so that the charge control is efficient, e.g. $10^{17}$ at/cm$^3$. A high $N_2$ doping is advantageous, but an upper limit tied up with the appearance of the tunnel effect between the two materials must be taken into consideration. By keeping to the range of some $10^{17}$ at/cm$^3$ for $N_2$ and choosing for example a value for $\Delta E_c$ between 0.4 and 0.5 eV, the tunnel effect is limited as well as the thermionic emission. This choice of $\Delta E_c$ is not limiting and depends on the aluminium concentration in $Al_xGa_{1-x}As$.

Thus, to charge values per unit of surface in the accumulation layer of the order of some $10^{-7}$Cb/cm$^2$ there corresponds a majority surface density close to $10^{12}$ electrons/cm$^2$, much greater than the interface state density which does not exceed $10^9$e/cm$^2$, and has then only a negligible influence on the operation of the transistor.

Figure 4:
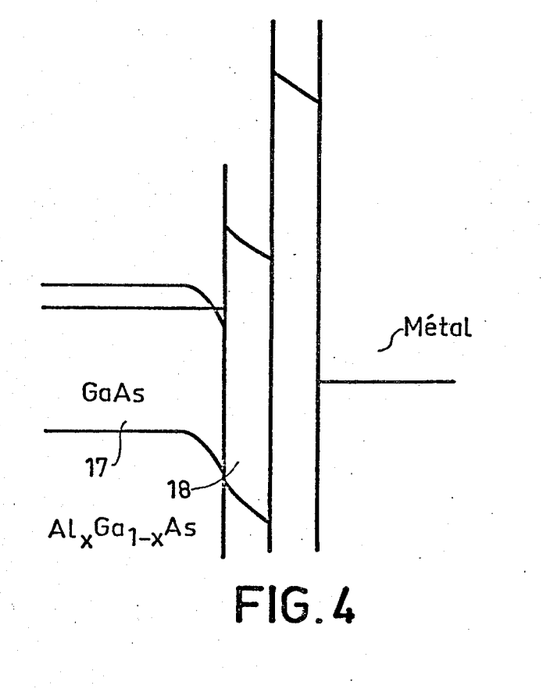
FIG. 4 is a diagram of the energy bands of an N—N isotypic heterojunction of the invention.

FIG. 4 shows the band diagram of the structure of the invention. On a little doped GaAs N layer 17 are deposited by any appropriate means an N doped $Al_xGa_{1-x}As$ layer 18, whose thickness is of the order of a few hundred angstroms, then an insulating layer and a metal deposit forming the gate of the transistor. Such a structure greatly minimises the leakage current between GaAs and the gate metal because of the high potential barrier, several electron volts, offered by the insulating material as is shown in FIG. 4.

The structure proposed by the invention differs from the conventional semi-conductor insulating material metal structure called MIS or MOS structure by the insertion, between the semi-conductor of the active layer GaAs and the layer of the insulating material, of a thin layer of $Al_xGa_{1-x}As$. It then keeps the advantage of the N—N isotypic heterojunction, i.e. good mobility of the electrons in the accumulation layer, but also the advantage of an MIS or MOS transistor by the existence of a low leakage current between the active layer and the gate.

The insulating layer of the proposed structure may be formed by a conventional insulating material such as $SiO_2$, $SiN_4$, $Al_2O_3$, etc . . . deposited on the $Al_xGa_{1-x}As$ layer. It may also be obtained from surface oxidization of the $Al_xGa_{1-x}As$ layer.

Figure 5:
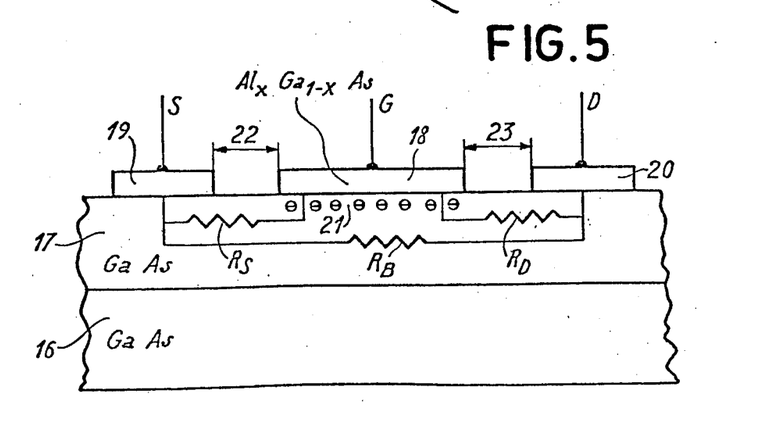
FIG. 5 is a schematical view in section of a heterojunction FET of the invention.

FIG. 5 shows an example of a majority accumulation heterojunction FET transistor, whose mode of operation has just been described.

The surface region 17 of a semi-insulating gallium arsenide substrate 16—i.e. with very high resistivity—is weakly doped, e.g. to about $10^{15}$ atoms per cubic centimeter. A gate electrode 18 is deposited on region 17. The gate electrode is made from $Al_xGa_{1-x}As$ doped to $10^{17}$ atoms per cubic centimeter for example. Two ohmic contact electrodes, formed by metallization, complete the device, the source is metallization 19 and the drain is metallization 20. The accumulation region 21 is the region situated in contact with the GaAs/$Al_xGa_{1-x}As$ junction, under gate 18.

Such a transistor may, for grid dimensions of $1 \times 500$ $\mu$m$^2$ convey 195 mA, with a transconductance of 82 mmho and a cut-off frequency of 32 GHz, for a gate voltage $V_G=1$ volt, the maximum velocity of the carriers being $2 \times 10^7$ cm/s.

This is then a device with relatively high transconductance and cut-off frequency capable of controlling fairly high currents. It is interesting to compare its performances with those of a depletion GaAs MES-FET of the same geometry and having an active layer of a thickness of 0.2$\mu$, the doping being $10^{17}$ at/cm$^3$. For a maximum velocity of the order of $1.5 \times 10^7$ cm/s, and for a gate voltage $V_G=0$, a MES-FET conveys 94 mA, has a transconductance of 60 mmho and a cut-off frequency of 24 GHz. Furthermore, in the case of a depletion FET, the electric performances fall off rapidly at high grid voltages because of the operating principle but also because of the high decrease of the maximum velocity in the vicinity of the layer-semi insulating substrate interface.

The device proposed in FIG. 5 is then advantageous compared with a conventional depletion MES-FET in so far as the transconductance, the cut-off frequency and the size of controlled currents are concerned. On the other hand, this transistor has a fairly low parallel output resistance $R_B$, between source and drain, due to the thickness of the GaAs active layer which remains neutral, i.e. outside the accumulation region. For a thickness of 1000 Å of the GaAs region 17, we find $R_B = 160\Omega$ a value which may be modified by choosing a smaller thickness for active layer 17 and a more resistive material.

Another drawback of the structure is tied up with the necessarily high resistivity of the weakly doped active layer leading to access resistances $R_S$ between source and gate and $R_D$ between drain and gate a priori very high in this geometry, according to which the distances 22, between source and a gate, and 23, between drain and a gate, are of the order of a micron. The two embodiments shown in FIGS. 6 and 7, by modifying the geometry, tend to minimise these access resistances $R_S$ and $R_D$.

Figure 6:
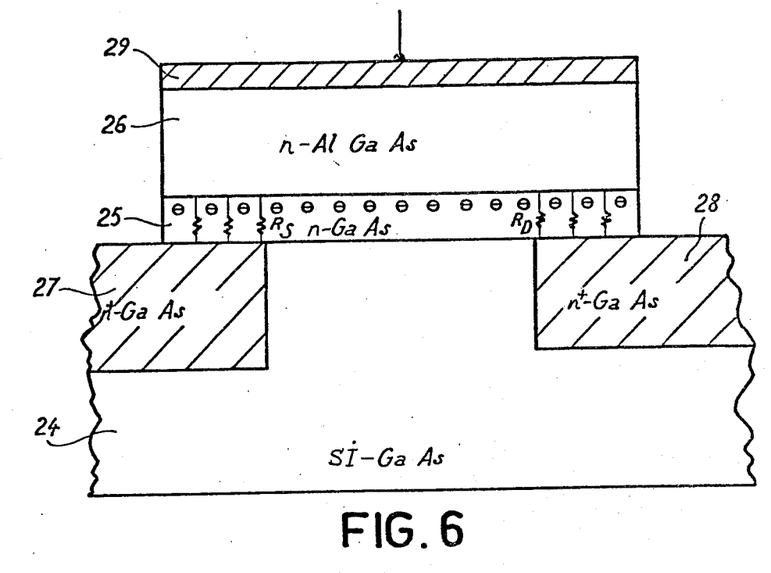
FIG. 6 is a first type of heterojunction FET transistor in accordance with the invention.

The first embodiment of a heterojunction FET transistor in FIG. 6 comprises, like that of FIG. 5, a semi-insulating GaAs substrate 24, an active weakly doped GaAs region 25 and an N doped $Al_xGa_{1-x}As$ gate 26. However, the source 27 and drain 28 regions, both made from GaAs with N+ conductivity, are implanted in the substrate below the epitaxy of regions 25 (active layer) and 26 (gate) which partially cover them.

The source 27 and drain 28 layers are provided by diffusion or implantation, and the active layer 25 with a thickness of only 1000 Å as well as the gate layer 26 are provided preferably by epitaxy by means of a molecular jet.

The fact that active layer 25 partially covers the source and the drain results in the access resistances $R_S$ between source and gate and $R_D$ between drain and gate being spread out and in addition only affect a distance of about 1000 Å, in comparison with distances 22 and 23 equal to 1 micron in the embodiment of FIG. 5. The access resistances $R_S$ and $R_D$ are then very low, which allows the transistor to have a higher cut-off frequency. The contacts are taken from the gate 26 by means of a metallization 29, and from the free faces of source 27 and drain 28 by means of two metallizations not shown in FIG. 6.

Figure 7:
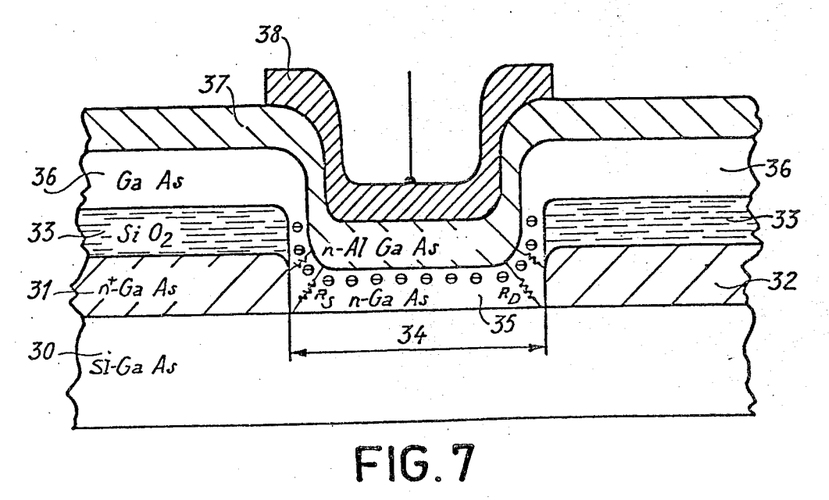
FIG. 7 is a second type of heterojunction FET transistor in accordance with the invention.

FIG. 7 shows another heterojunction FET transistor embodiment, in which the access resistances $R_S$ and $R_D$ are again spread out through the thickness of the active layer, the overlapping not being achieved in this case by the principal faces of the layers but by the end faces, a layer being considered as parallelepiped.

This transistor is constructed as follows: on a semi-insulating GaAs substrate 30 are formed the source 31 and drain 32, both from N+ doped GaAs, then a silica insulating layer 33. With a hole reserve in the designated region 34, between source and drain, the GaAs active layer 35 is deposited in the hole, preferably by molecular jet epitaxy. In fact, when the GaAs layer 35 is deposited in the hole, a layer 36 also covers the SiO₂ layer 33: only part 35 of this layer is conducting, layer 36 being very resistive. The $Al_xGa_{1-x}As$ gate 37 is then deposited on the preceding one within the perimeter alone of the hole, highly N doped, before being covered with a contacting metallization 38. The doping is carried out according to conventional techniques with such materials: silicon, sulfur, selenium, tin for example may be used for doping agents.

Only the central active part of this transistor is shown in FIG. 7: source 31 and drain 32 regions have, as in FIG. 6, a free surface for making contact.

In this embodiment, the thicknesses are of the order of 2 to 3000 Å for layers 31 and 32, as well as for silica layer 33, less than 1000 Å for the active layer 35, and 2 to 3000 Å for grid 37. Thus, the access resistances $R_S$ between source and grid and $R_D$ between drain and grid are spread out over 2 to 3000 Å—the thickness of the source and drain layer—and, considering the thinned portion of the active layer 35 in the vertical part of the hole, have a length less than 1000 Å, which promotes high frequencies.

Figure 8:
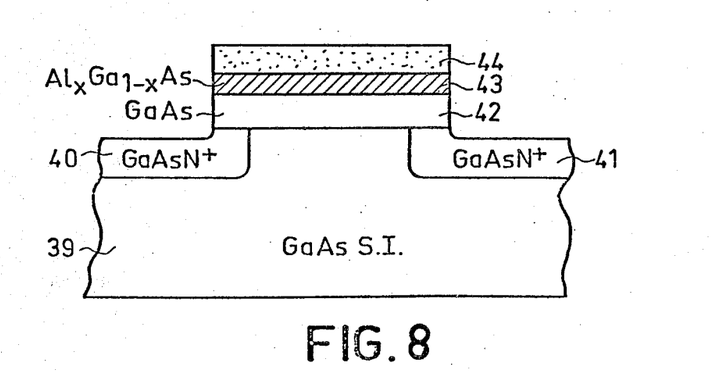
FIG. 8 is a type of heterojunction field effect transistor comprising an insulating layer in accordance with the invention.

FIG. 8 shows an embodiment of a heterojunction transistor comprising an insulating layer. This transistor is formed on a semi-insulating GaAs substrate 39, two source 40 and drain 41 regions made from N+ doped GaAs are implanted or diffused in the substrate. Then the weakly doped GaAs type N layer 42 and the $Al_xGa_{1-x}As$ layer 43 a few hundred angstrom in thickness are deposited and finally insulating layer 44 is formed by one of the processes described above. The mesa is then freed, i.e. the projecting part formed by the GaAs/$Al_xGa_{1-x}As$/insulating material stack.

Figure 9:
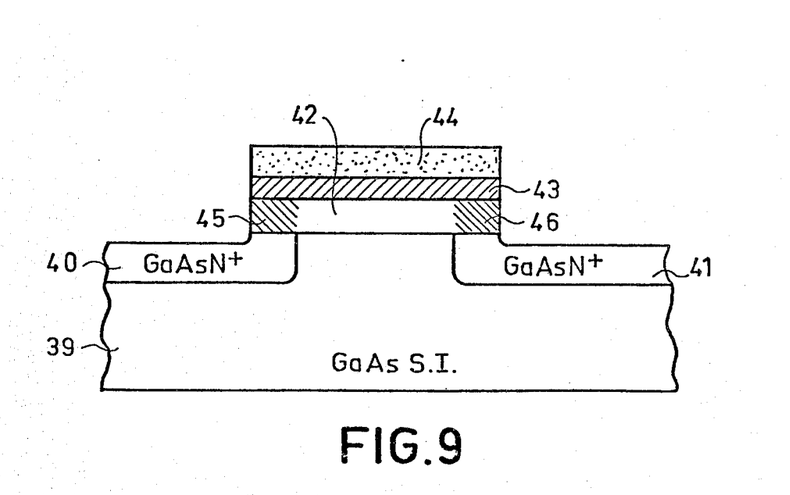
FIG. 9 shows in section an N—N isotypic heterojunction field effect transistor of the prior art showing the access resistance zones.

FIG. 9 is comparable to FIG. 8 but it shows access resistances between source and gate and between drain and gate which largely result from the respective existence of weakly doped regions 45 and 46.

Figure 10:
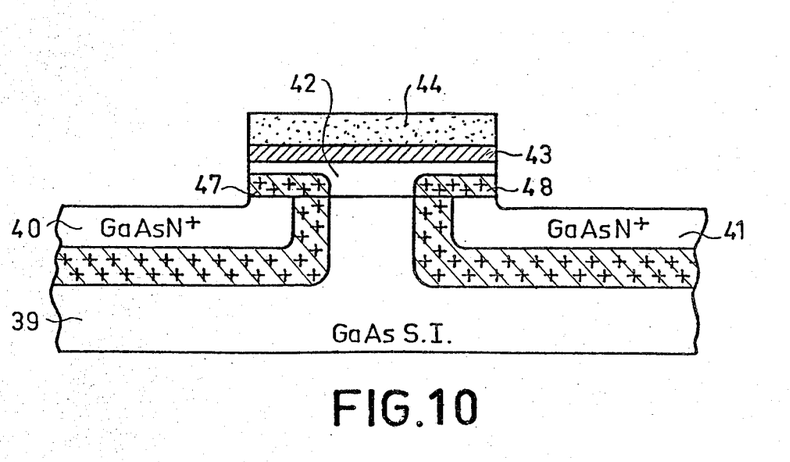
FIGS. 10, 11 and 12 show in section several heterojunction field effect transistors with low access resistance $R_s$ and $R_d$ in accordance with the invention.

FIG. 10 shows how these weakly doped regions 45 and 46 are eliminated by extension of the n+ source 47 and drain 48 regions into the GaAs layer 42 close to the low resistivity accumulation region.

This extension of N+ zones into the weakly doped GaAs layer is obtained by diffusion of impurities, which may be carried out as follows.

Doping elements having a high thermal diffusion coefficient, such as sulfur, are first of all implanted in the semi-insulating substrate 39 at the position of the N+ zones 40 and 41. The weakly doped GaAs layer 42 and the N doped $Al_xGa_{1-x}As$ layer 43 are then formed by epitaxy after previously determining the depth of the GaAs layer 42. The whole of the structure is then baked so that the defects due to the implantation are eliminated and so that the doping element diffuses towards the regions 47 and 48, after previously determining the depths of regions 47 and 48, in particular of the GaAs layer 42. The thickness of the GaAs layer 42 is fixed so that regions 47 and 48 penetrate into the electron accumulation region. During baking, doping impurities contained in the $Al_xGa_{1-x}As$ layer 43 also diffuse towards the GaAs layer 42 if care is not taken to dope the $Al_xGa_{1-x}As$ layer only at a certain distance from the interface with the GaAs layer, said distance corresponding to the length of diffusion of the impurity doping $Al_xGa_{1-x}As$.

Since the thickness of the electron accumulation layer is from a few tens to a few hundred angstrom, control of the diffusion is delicate for regions 47 and 48 to just penetrate into the accumulation layer. In an extreme case, the regions 47 and 48 may go beyond the electron accumulation layer and penetrate into the $Al_xGa_{1-x}As$ layer 43, but this thin layer completely depopulated of electrons does not let the current pass between source and drain.

Figure 11:
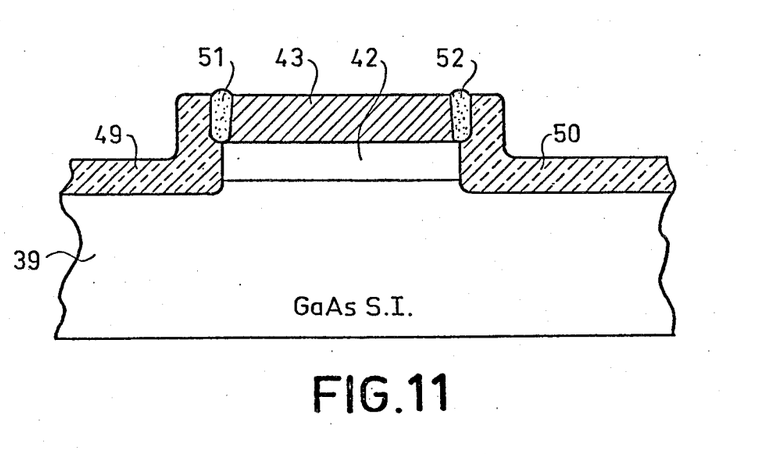

FIG. 11 shows another embodiment of a heterojunction field effect transistor with low access resistance $R_s$ and $R_d$. This transistor comprises a semi-insulating substrate 39, a GaAs layer 42 and an $Al_xGa_{1-x}As$ gate 43. However, the sources and drains are obtained directly by metallizations, 49 for the source and 50 for the drain, on the side of the projecting part formed by the stack of GaAs and $Al_xGa_{1-x}As$ layers which has been called mesa.

These metallizations cover at one and the same time the sides of the GaAs and $Al_xGa_{1-x}As$ layers. They are of the type with ohmic contact on GaAs, having a doping rate of the order of $10^{17}$ atoms per cm³. They form then an ohmic contact with the electron accumulation layer. The access resistances $R_s$ and $R_d$ are consequently reduced and strictly limited to those of the accumulation layers.

To prevent the metallizations from creating a leakage current between source and drain, through the $Al_xGa_{1-x}As$ layer, this latter is isolated from the source and drain contacts by oxide layers 51 and 52 of a thickness of the order of a few angstroms. These layers are obtained by surface oxidization of the sides of the mesa. This oxidization is much deeper in layer $Al_xGa_{1-x}As$ than in layer GaAs because $Al_xGa_{1-x}As$ is more oxidizable than GaAs. Before depositing the source and drain ohmic contacts, the surface oxide layer of GaAs is removed by conventional methods such as cathode spraying.

Figure 12:
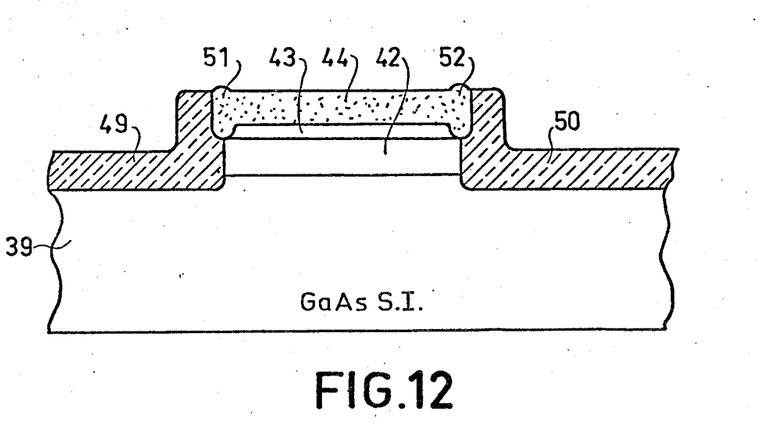

FIG. 12 shows another embodiment of the structure of the preceding figure, the transistor having further an insulating layer 44 deposited on gate 43, this latter being thin.

It is apparent that within the scope of the invention, modifications and different arrangements can be made other than are here disclosed. The present disclosure is merely illustrative with the invention comprehending all variations thereof.

What is claimed is:

1. In a field effect transistor with high cut-off frequency having a source access region and a drain access region formed on a portion of a semi-insulating substrate and a control region formed from an active layer and a gate whose interface with said active layer forms a junction wherein said control region is deposited on a portion of the surface formed by said substrate and said source and drain regions, the improvement comprising:

said junction being a heterojunction between two different materials with said active layer having GaAs of the type N with an electron concentration less than $10^{16}$ e/cm³ and said gate being $Al_xGa_{1-x}As$ of type N with an electron concentration of approximately $10^{17}$ e/cm³ with x between 0.2 and 1 and being of a thickness of between 100 and 2000 angstroms and a gate contact metallization; and said source and drain regions extending into said GaAs active layer as far as an electronic accumulation region which is adjacent the heterojunction between active layer and said gate layer.

2. The field effect transistor as claimed in claim 1, wherein the region situated adjacent the heterojunction, on the active layer side, forms an accumulation layer for the majority charge carriers (electrons).

3. The field effect transistors claimed in claim 1, wherein said source and drain regions are diffused in said semi-insulating substrate, wherein said active layer and said gate layer, both of N type conductivity, are deposited on the substrate so that the active layer partially covers the source and drain regions, whereby the access resistances between source and gate and between drain and gate are reduced, which increases the cut-off frequency of said transistor.

4. The field effect transistor as claimed in claim 1, wherein the source and drain regions are epitaxied on the semi-insulating substrate, said regions being covered by a silica layer, the active GaAs type N doped layer then being deposited in the area which, at the surface of the substrate, separates the source and drain regions, and the $Al_xGa_{1-x}As$ N type doped gate region being deposited on said doped GaAs layer within the perimeter of said area, the heterojunction between GaAs $Al_xGA_{1-x}As$ thus being limited in the area between the source and drain regions, which results in reducing the access resistances between source and gate on the one hand, and between drain and gate, on the other hand and in increasing the cut-off frequency of the transistor.

5. The field effect transistor as claimed in claim 1, wherein an insulating layer inserted between said $Al_xGa_{1-x}As$ layer and the gate metallization is a derivative of silicon, such as oxide $SiO_2$ or nitride $Si_3N_4$.

6. The field effect transistor as claimed in claim 1, wherein an insulating layer inserted between said $Al_xGa_{1-x}As$ layer and the gate metallization is a derivative of aluminum, such as oxide $Al_2O_3$, obtained by direct deposit or by surface oxidization of the $Al_xGa_{1-x}As$ layer.

7. The field effect transistor as claimmed in claim 11, wherein source and drain contact metallizations are deposited on the side of a mesa formed by the $Al_xGa_{1-x}As$ and GaAs layers, so as to form ohmic contacts with the electron accumulation layer in GaAs, the metallizations being electrically isolated from the $Al_xGa_{1-x}As$ layer by oxide layers of a thickness of a few ten to a few hundred angstrom.

8. The field effect transistor as claimed in claim 1 further including an insulation layer inserted between said gate and said gate contact metallization.

* * * * *